United States Patent [19]

DeMaria et al.

[11] Patent Number: 4,663,746
[45] Date of Patent: May 5, 1987

[54] SELF-SCANNED TIME MULTIPLEXER WITH DELAY LINE

[75] Inventors: Anthony J. DeMaria, West Hartford, Conn.; Thomas M. Reeder, Portland, Oreg.

[73] Assignee: United Technologies Corporation, Hartford, Conn.

[21] Appl. No.: 637,061

[22] Filed: Aug. 2, 1984

[51] Int. Cl.[4] .............................................. G01S 3/80
[52] U.S. Cl. ................................... 367/119; 333/150
[58] Field of Search ......................... 367/103, 78–80, 367/131, 119; 333/150; 73/626

[56] References Cited

U.S. PATENT DOCUMENTS

| | | | |
|---|---|---|---|
| 2,640,925 | 6/1953 | Hirsch | 250/27 |
| 2,799,728 | 7/1957 | Aasma et al. | 179/15 |
| 2,920,276 | 1/1960 | Jonker et al. | 330/10 |
| 3,246,164 | 3/1966 | Richmond | 307/81 |
| 3,360,770 | 12/1967 | Friedman et al. | 367/161 |
| 3,435,250 | 3/1969 | Reggia | 307/88.3 |
| 3,568,102 | 3/1971 | Chin-Chong Tseng | 333/30 |
| 3,593,046 | 7/1971 | Sandbank et al. | 307/299 |
| 3,648,081 | 3/1972 | Lean et al. | 310/8.1 |
| 3,684,892 | 8/1972 | Lean et al. | 307/88.3 |
| 3,713,048 | 1/1973 | Dias | 332/52 |
| 3,875,550 | 4/1975 | Quate et al. | 367/103 |

OTHER PUBLICATIONS

R. M. White and F. W. Voltmer, *Applied Physical Letters*, vol. 7, No. 12, "Direct Piezoelectric Coupling" (Dec. 15, 1965).

*Primary Examiner*—Thomas H. Tarcza
*Assistant Examiner*—Daniel T. Pihulic
*Attorney, Agent, or Firm*—Robert P. Sabath

[57] ABSTRACT

Self-scanned piezoelectric delay line effective for time multiplexing system sampled physical parameters, subject to frequency mixing of the product signals from a clocked RF signal generator passing through a plurality of electrodes in the delay line, and the signals of voltage controlled oscillators driven by sensor detectors linked to the physical system.

4 Claims, 2 Drawing Figures

SELF-SCANNED TIME MULTIPLEXER WITH DELAY LINE

TECHNICAL FIELD

This invention relates to a new and improved technique for combining sampled data outputs from many sensors into a single output terminal while providing complete isolation between the respective sensors.

BACKGROUND ART

Arrangements for combining sampled data outputs from many sensors have been known for some time. Such arrangements have in the past also addressed the problem of isolating the respective sensors from one another, while their outputs were being combined.

Moreover, the direct piezoelectric coupling of surface elastic waves between electrodes from a pulsed oscillator to receiver circuitry is also well known. See "Direct Piezoelectric Coupling to Surface Elastic Waves" by R. M. White and F. W. Voltmer in Vol. 7, No. 12 *Applied Physical Letters* (Dec. 15, 1965).

However, the combination of sampled data outputs by using voltage or current sampled data outputs to modulate voltage controlled oscillators coupled to a piezoelectric acoustic delay line with mixing diodes is a new and improved technique exhibiting substantial advantages over the prior art.

Accordingly, it is an object of the invention to develop a new and improved arrangement for time multiplexing a plurality of samplable voltage and/or current inputs.

More particularly, it is an object of the invention herein to conduct time multiplexing of a plurality of electrical inputs in an arrangement of voltage controlled oscillators diode coupled to an acoustic delay line.

DISCLOSURE OF INVENTION

According to one version of the invention, the outputs of a plurality of sensors drive separate voltage tuned oscillators each of which is, connected individually to a series of forward-biased semiconductor diodes. The diodes, in turn, are electrically connected to an arrangement of individual input transducer taps on a piezoelectric surface acoustic wave delay line, and interspersed with similar output transducers.

According to this version of the invention, the outputs of each voltage controlled oscillator are ungrounded to enable the individual taps to be connected directly across mixing diodes arranged in series.

In another version of the invention, the voltage controlled oscillator outputs and taps are each series connected with a corresponding one of the individual diodes, which in turn are connected to a common load resistor. Separate bias resistors are employed in this case to provide isolation between taps.

BRIEF DESCRIPTION OF DRAWING

The invention is best understood by reference to the drawing, which is in several figures, wherein.

BEST MODE FOR CARRYING OUT THE INVENTION

Figure 1:
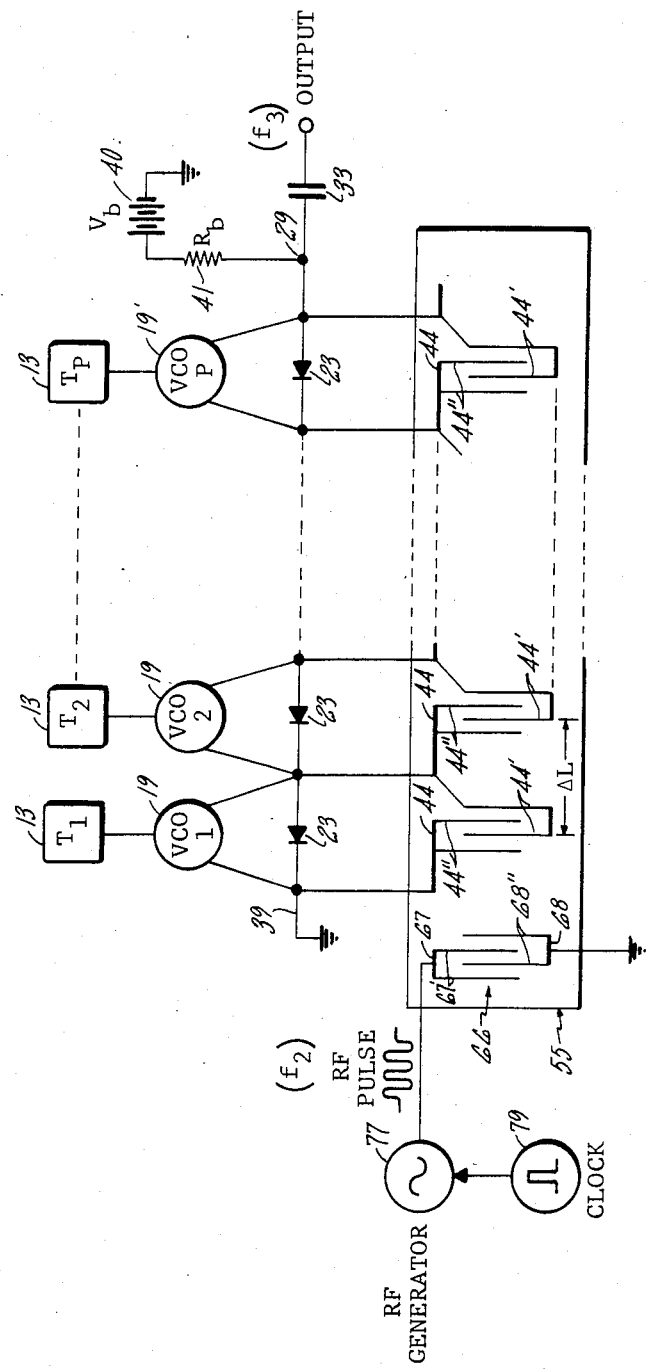
FIG. 1 is a schematic of one version of the invention in which a plurality of sensor transducers drive a respective plurality of voltage controlled oscillators diode coupled to a piezoelectric surface acoustic wave delay line.

FIG. 1 shows the voltage or current outputs of a plurality of sensor transducers 13 connected to a physical system (not shown) being monitored. The transducers 13 are arranged in series with respect to corresponding ones of a plurality of voltage controlled oscillators 19 each of which has its own nominal center frequency.

One side of the output of a first one 19' of said voltage controlled oscillators 19 is grounded. The other side of the output of the first one 19' of said voltage controlled oscillators 19 is connected to the anode of the first one 23' of a plurality of mixing diodes 23 connected between the outputs of corresponding voltage controlled oscillators 19.

The successive mixing diodes 23 are connected end on end with respect to one another, with the cathode of one diode 23 connected to the anode of the next, thereby establishing, in effect, a chain of diodes 23 with an output anode terminal 29" connected to output capacitor 33, and with cathode terminal 39 being connected to ground. The output anode terminal 29" is additionally connected to a bias voltage 40 through bias resistor 41.

The respective anodes and cathodes of diodes 23 are connected to respective input terminals 44 including a pair of input fingers 44" and a pair of output fingers 44' on a piezoelectric surface acoustic wave delay line 55. The respective input terminals 44 are spaced with respect to one another by a distance "L".

The piezoelectric surface acoustic wave delay line 55 includes in addition to respective input terminals 44, an RF input connection 66 including input and grounded electrodes, respectively 67 and 68, the input electrode 67 in turn coupled to an RF signal generator 77 producing a selected input frequency signal passed during a pulse duration controlled by clock 79. The delay line transducer arrangement is thus subject to RF signals generated under control of a clock circuit. This causes a coherent RF pulse to be applied to the delay line transducer arrangement. The width of each RF pulse is selected to be equal to the transit time between delay line taps, which is the length between the taps divided by the surface wave velocity. The input electrode 67 includes a pair of separate input electrode fingers 67', and the grounded electrode 68 includes a pair of output electrode fingers 68".

Each of input electrode fingers 67' and output electrode fingers 68" are each separated with respect to each other in the direction of acoustic wave propagation by a one-half wavelength distance. Further, the ends of electrodes 67 and 68 are quarter wavelength separated, as shown in FIG. 1.

This establishes an acoustic wave of wavelength twice the separation between electrode ends, which travels at a velocity determined by the kind of piezoelectric substrate material selected for delay line 55. This provides a stable RF voltage level at each tap along the delay line lasting for a brief period of time.

After a period of time determined by the selected separation distance, the acoustic wave reaches the nearest electrode 44 and induces a signal based upon the frequency of generator 77 which is applied across first diode 23'. This signal is mixed with the output frequency of first voltage controlled oscillator 19', producing sum and difference frequency signals which are transmitted across capacitor 33 to the output. The signal amplitude within the frequency bandwidth encompassing the sum or difference frequency signal is indicative of the state or value of the sensor/transducer 13 corresponding to voltage controlled oscillator 19'.

After another predetermined period of time, the acoustic wave reaches the next or adjacent electrode 44, causing mixing activity at a next diode 23 with respect to another voltage controlled oscillator 19. The mixed frequency signals are again transmitted to the output, this time indicating the state or value of a next sensor/transducer 13.

The acoustic wave thus travels from electrode to electrode 44, addressing each of the sensor/detectors 13 at a time by mixing action across a corresponding diode 23. The electrodes 44 are preferably equally spaced with respect to each other, permitting the establishing of a regular time interval between successive address times of sensor/detectors 13. When the surface wave has run the entire course or length of the delay line 55, each of the sensor/detectors 13 will have been addressed. Even more importantly, by the expiration of this time, the output will have seen in serial succession the amplitudes of the levels or values of each of sensor/detectors 13 at several frequencies defined by the respective voltage controlled oscillators 19, all of which frequencies are within an acceptable range for reception by analysis circuitry (not shown) which can be connected to the output.

Assuming that the RF pulse is essentially unmodified during its transit through the delay line, i.e. that the taps are weakly coupled, the sum or difference frequency outputs along the diode chain are directly related to the amplitude and frequency of a corresponding voltage controlled oscillator at the time and space position of each RF pulse. Accordingly, the time output at a given output port is dividable into a plurality of intervals which correspond to individual ones of the plurality of sensors being read out. The sensor information being read out during these intervals can be coded in either or both of amplitude, and phase or frequency modulation forms.

The maximum number of sensors capable of being read out by a single device is limited only by the length of the surface-wave delay line selected. Tap and sensor counts as high as one hundred appear feasible. Moreover, in the case of microelectronic sensors such as photo-diode optical arrays, the total number of the tap and sensor count can be even higher.

The sampling time, which is equal to the RF pulse period, can be very short, provided that it substantially exceeds the time period of the frequencies mixed. Accordingly, for mixed frequencies of ten and one megahertz, a sampling time over one microsecond is required.

Figure 2:
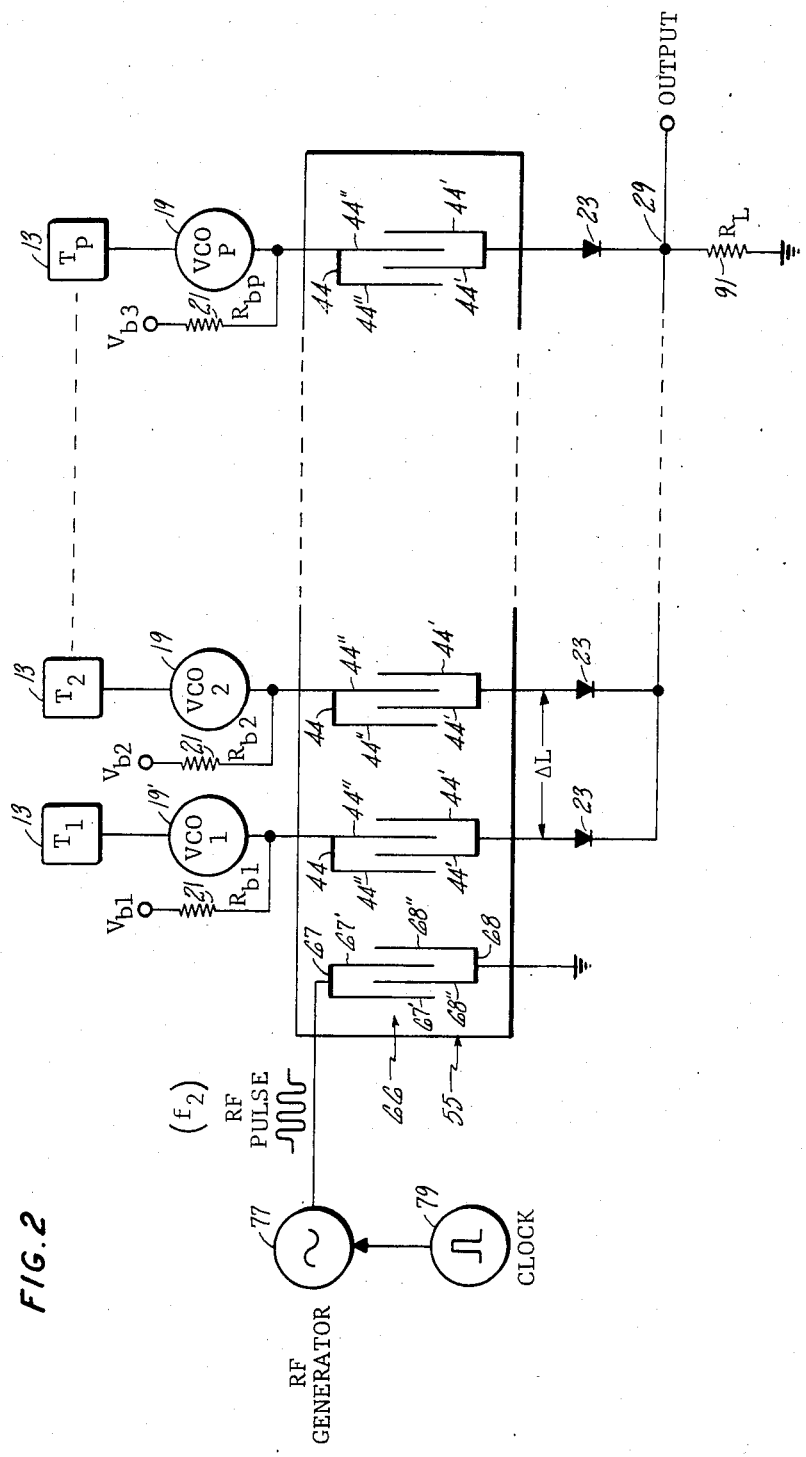
FIG. 2 is a schematic of another version of the invention showing a similar arrangement of sensor transducers connected to an acoustic delay line through a plurality of corresponding voltage controlled oscillators, but in this version additionally including isolation resistors at the outputs of the respective voltage controlled oscillators, and including series diodes leading to a load resistor on the output side of the acoustic delay line.

In lieu of the arrangement in FIG. 1, that of FIG. 2 can be employed. The arrangement is essentially the same, including a similar number of sensor/detectors 13 connected at respective inputs of voltage controlled oscillators 19 and 19'. Moreover, the outputs of the respective voltage controlled oscillators 19 are connected to electrodes 44 including ends 44' for combination with frequency signals from an RF signal generator 77 as before. Additionally, the RF signal generator 77 is subject to control by a clock 79, as before. The RF signal generator 77 again establishes an acoustic wave at regular time intervals at input connection 66 including electrodes 67 and 68.

In the arrangement of FIG. 2, however, the individual voltage controlled oscillators 19 and 19' are subject to individually settable output biasing voltages acting through separate driving biasing resistors 21, which are individually selected for suitable resistive value depending upon the particular characteristics of each corresponding voltage controlled oscillator 19.

Furthermore, the mixing diodes 23 of FIG. 2 are arranged in parallel with respect to each other, and their respective cathodes are all connected to a common output node 29 leading to ground through load resistor 91. Each of diodes 23 may be provided with an individual biasing voltage through a corresponding biasing resistor (not shown), permitting adjustment in accordance with any variation in the actual characteristic of the mixing diode 23 employed at a given position in the arrangement.

Finally, the input terminals 44 of the version according to FIG. 2 do not include output fingers 44' connected therewith. Instead, FIG. 2 includes independent output terminals 45 each in turn including a pair of output fingers 45'.

With respect to the construction of the actual delay line 55, a substrate of a suitable piezoelectric material such as crystalline quartz or lithium niobate for example may be employed. On this substrate, electrodes of copper or aluminum for example are fabricated by well known photolithographic techniques or otherwise as is well known in the art.

In the case of monolithic arrays of voltage controlled oscillators and nonlinear mixing diodes, it is possible monolithically to fabricate the entire assembly on a single semiconductor substrate, enabling inexpensive construction of the entire mixer arrangement.

Furthermore, by employing piezoelectric film overlay technology, the surface wave delay line can be fabricated on a common substrate as well. Moreover, a combination of integrated circuit and film technology permits the clock and RF pulse generation circuit also to be fabricated on the same substrate. Thus, the device is capable of ultimate development on a single monolithic substrate connected directly to the sensors employed.

The above exposition and detailed explanation thereof may suggest to individuals skilled in the art other ways of carrying out the invention. Accordingly, reference is urged to the claims which follow, since these express with particularity the metes and bounds of the invention addressed herein.

We claim:

1. A surface acoustic wave multiplexer, characterized by:
   a plurality of voltage-controlled oscillator means for each producing an output frequency signal indicative of the voltage level of an electrical input;
   a corresponding plurality of mixer means, each connected to a corresponding one of said voltage-controlled oscillator means, for each mixing a pair of input frequency signals, one of which is derived from the corresponding one of said plurality of oscillator means and effective for producing at least a single mixed signal frequency;

a surface acoustic wave device for transmitting acoustic waves along a characteristic direction of propagation at a characteristic velocity, said surface acoustic wave device including plurality of pairs of electrodes spaced apart by a predetermined distance and having a characteristic transit time for a signal traveling at said characteristic velocity to pass between adjacent pairs of electrodes;

an RF generator including an output for producing a signal frequency to be transmitted along said said surface acoustic wave device, clock means for controlling said RF generator by establishing the pulse width of the signal frequency output from said RF generator means such that said pulse width is less than said transit time, said surface acoustic wave means including input electrodes, connected to said RF generator, for transducing said signal frequency to acoustic form effective for traveling toward and along said plurality of pairs of electrodes;

one of said pairs of electrodes being connected to a corresponding one of said plurality of mixer means and being effective for applying said signal frequency from said RF generator to said corresponding one of said mixer means during the period of residency of said signal frequency at said one of said electrode pairs so that said signal frequency and said outut frequency from said voltage-controlled oscillator mix in said corresponding one of said mixer means to produce said mixed signal frequency; and an output terminal connected to said plurality of mixer means for receiving signals therefrom, whereby said output terminal receives a plurality of mixed signal frequencies, each representing an electrical input from one of said plurality of voltage-controlled oscillator means, and each being separated in time by said characteristic transit time, whereby said multiplexer converts said voltage levels associated with said plurality of voltage-controlled oscillator means to a time-multiplexed plurality of mixed signal frequencies.

2. The multiplexer of claim 1, further characterized in that said plurality of pairs of electrodes are electrically connected sequentially with a plurality of intermediate electrode nodes between adjacent electrodes;

said plurality of mixer means are directly connected to said corresponding voltage-controlled oscillator means at floating voltage-controlled oscillator output terminals;

said plurality of mixer means are series-connected with a plurality of intermediate mixer nodes between adjacent ones of said plurality of mixer means and first and last nodes at opposite ends of said series-connected plurality of mixer means;

said intermediate electrodes nodes are connected to said intermediate mixer nodes; and said output terminal is connected to said last node.

3. The multiplexer of claim 1, further characterized in that said plurality of pairs of electrodes are electrically independent and acoustically coupled through surface acoustic waves;

each of said voltage-controlled oscillator means is directly connected to one of said plurality of pairs of electrodes, the other of said pair being connected to a terminal of one of said plurality of mixer means; and each of said plurality of mixer means is a diode having a diode terminal connected to a common multiplexer output terminal.

4. The multiplexer of claim 3 further characterized in that said oscillator output terminal is further connected to bias means for applying a predetermined bias potential thereto.

* * * * *